(12) United States Patent
Blackburn et al.

(10) Patent No.: US 9,854,717 B2
(45) Date of Patent: *Dec. 26, 2017

(54) CHARGER COOLING AIR SOURCE SELECTION METHOD

(71) Applicant: FORD GLOBAL TECHNOLOGIES, LLC, Dearborn, MI (US)

(72) Inventors: Thomas Blackburn, Canton, MI (US); Monica DuBois, Commerce Township, MI (US); James George Gebbie, Rochester Hills, MI (US); Kenneth J. Jackson, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 922 days.

This patent is subject to a terminal disclaimer.

(21) Appl. No.: 14/033,822

(22) Filed: Sep. 23, 2013

(65) Prior Publication Data

US 2015/0087215 A1    Mar. 26, 2015

(51) Int. Cl.
*B60H 1/00* (2006.01)
*H05K 7/20* (2006.01)
*B60H 1/24* (2006.01)
*B60L 1/00* (2006.01)
*B60L 1/02* (2006.01)
*B60L 3/00* (2006.01)
*B60L 11/18* (2006.01)

(52) U.S. Cl.
CPC ..... *H05K 7/20845* (2013.01); *B60H 1/00278* (2013.01); *B60H 1/24* (2013.01); *B60L 1/003* (2013.01); *B60L 1/02* (2013.01); *B60L 3/003* (2013.01); *B60L 11/1816* (2013.01); *B60L 11/1861* (2013.01); *B60L 11/1874* (2013.01); *B60H 2001/003* (2013.01); *B60L 2240/28* (2013.01); *B60L 2240/34* (2013.01); *B60L 2240/36* (2013.01); *B60L 2240/525* (2013.01); *Y02T 10/7005* (2013.01); *Y02T 10/705* (2013.01); *Y02T 10/7044* (2013.01); *Y02T 10/7072* (2013.01); *Y02T 90/14* (2013.01)

(58) Field of Classification Search
CPC   B60H 1/00278; B60H 1/24; B60H 2001/003; B60H 1/244; H05K 7/20845; B60L 11/1874
USPC .......................................................... 454/70
See application file for complete search history.

(56) References Cited

U.S. PATENT DOCUMENTS 4,989,499 A * 2/1991  Scoccia ................. B60H 1/247
                                                                   454/70
5,391,111 A * 2/1995  Girard ..................... B60H 1/00
                                                                  454/103

(Continued)

FOREIGN PATENT DOCUMENTS

KR        20070057542 A      6/2007

*Primary Examiner* — Steven B McAllister
*Assistant Examiner* — Jonathan Cotov
(74) *Attorney, Agent, or Firm* — David Kelley, Esq.; Tung & Associates

(57) ABSTRACT

A charger cooling air source selection method includes cooling a vehicle battery charger by opening an outside air vent door in a vehicle and drawing outside air through the outside air vent door; determining whether the outside air vent door will close; and if the outside air vent door will not close, establishing and maintaining positive air pressure in a cabin of the vehicle by ensuring an open configuration of a recirculation door in the vehicle.

20 Claims, 5 Drawing Sheets

(56) References Cited

U.S. PATENT DOCUMENTS

| | | | | |
|---|---|---|---|---|
| 5,524,446 A * | 6/1996 | Hotta | ................ | B60H 1/00392 165/43 |
| 5,836,813 A | 11/1998 | Miyata et al. | | |
| 7,005,821 B2 * | 2/2006 | Sunaga | .............. | B60H 1/00857 165/202 |
| 7,451,608 B2 * | 11/2008 | Kikuchi | ............ | B60H 1/00278 62/186 |
| 7,988,543 B2 * | 8/2011 | Major | ................ | B60H 1/00278 454/107 |
| 8,602,091 B2 * | 12/2013 | Nemoto | ............. | B60H 1/00278 165/202 |
| 8,662,968 B2 * | 3/2014 | Leffert | ............... | B60H 1/00278 165/42 |
| 8,950,533 B2 * | 2/2015 | Nemesh | .............. | B60L 11/1812 165/72 |
| 2002/0000254 A1 | 1/2002 | Sato et al. | | |
| 2002/0009969 A1 | 1/2002 | Sato | | |
| 2009/0071178 A1 * | 3/2009 | Major | ................ | B60H 1/00278 62/239 |
| 2009/0088062 A1 * | 4/2009 | Major | ................ | B60H 1/00278 454/70 |
| 2010/0089669 A1 * | 4/2010 | Taguchi | ............ | B60H 1/00257 180/65.1 |
| 2011/0016899 A1 * | 1/2011 | Ogura | ................ | B60H 1/00278 62/239 |
| 2011/0059341 A1 * | 3/2011 | Matsumoto | ........ | B60H 1/00278 429/82 |
| 2011/0165830 A1 * | 7/2011 | Smith | ................ | B60H 1/00278 454/75 |
| 2011/0298241 A1 * | 12/2011 | Varns | ................ | B60H 1/00014 296/64 |
| 2012/0003910 A1 * | 1/2012 | Richter | ............. | B60H 1/00278 454/141 |
| 2013/0337296 A1 * | 12/2013 | Cardoso | ................ | H01M 2/12 429/61 |
| 2014/0196866 A1 * | 7/2014 | Bezzina | ............ | B60H 1/00278 165/42 |

* cited by examiner

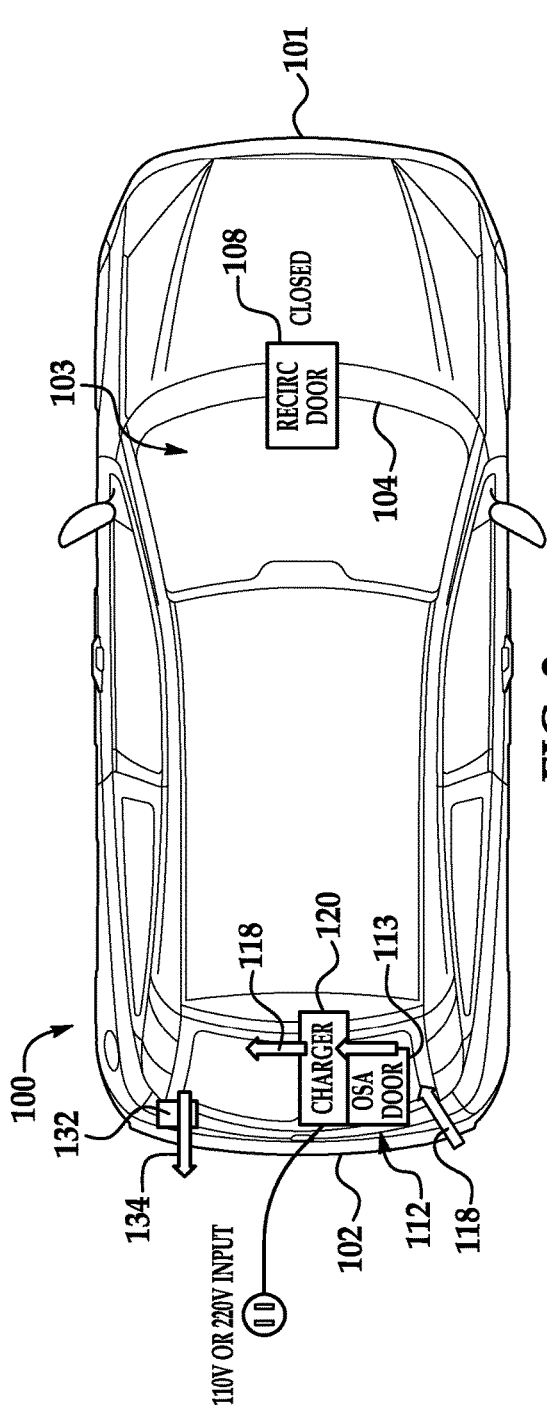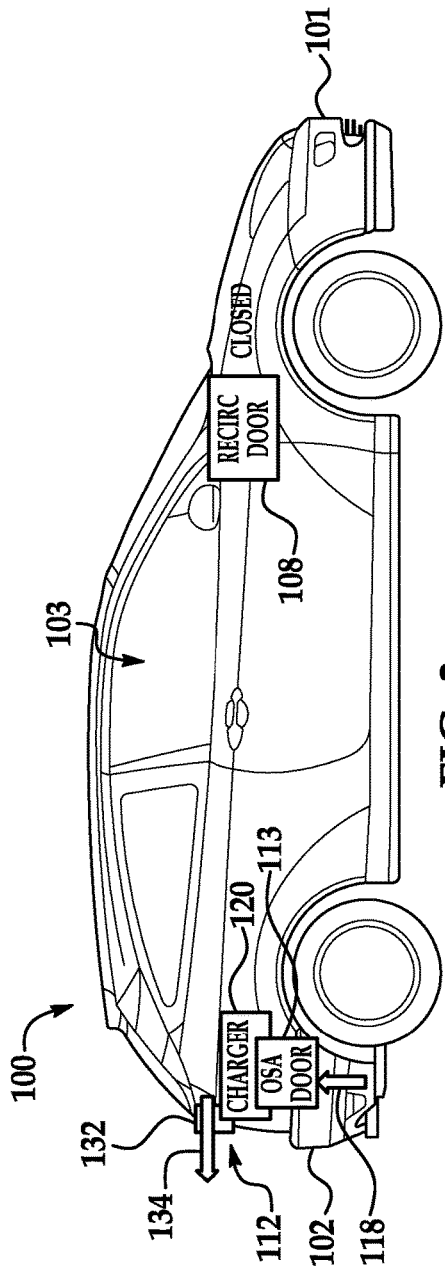
FIG. 2
FIG. 3

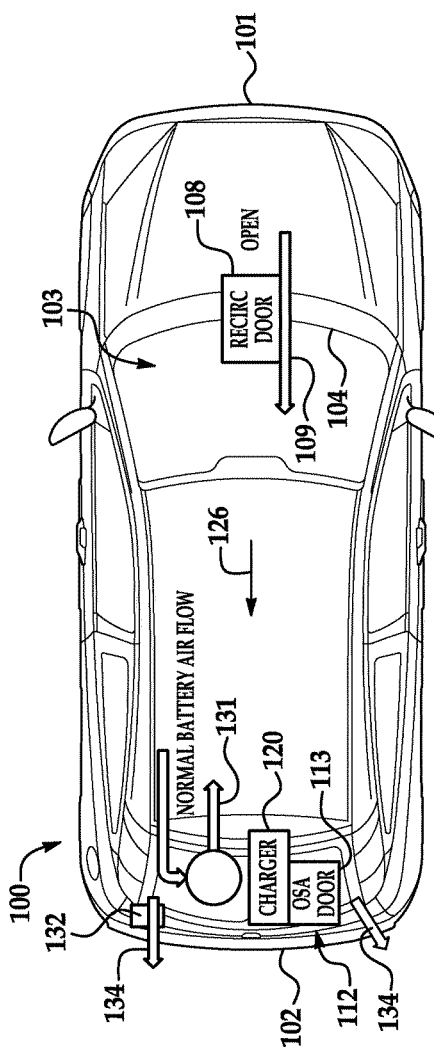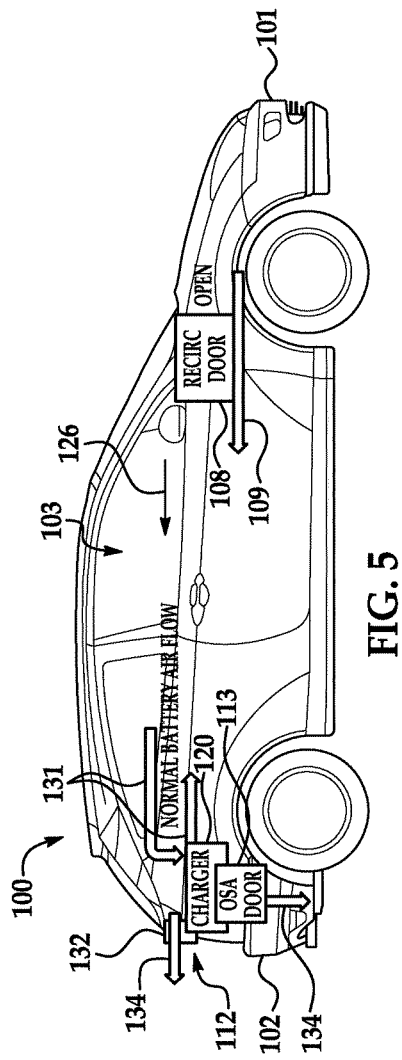
FIG. 4
FIG. 5

CHARGER COOLING AIR SOURCE SELECTION METHOD

FIELD

Illustrative embodiments of the disclosure generally relate to outside air (OSA) vent systems which facilitate flow of cool outside air into the vehicle to cool a battery charger in the vehicle. More particularly, illustrative embodiments of the disclosure relate to a charger cooling air source selection method which facilitates positive air pressure in a vehicle to prevent inflow of outside air in the event that the OSA vent system does not close.

BACKGROUND

High voltage chargers in PHEV (plug-in hybrid elective vehicles) can become sufficiently heated to warm the cabin air inside the vehicle depending on the starting interior temperature of the vehicle. Circulating inside air to cool the charger for several hours can heat up the inside vehicle air, rendering the charger inefficient.

When the charger requires cooling and the inside cabin air is above a set temperature level, introduction of outside air into the vehicle cabin through an outside air (OSA) vent system in the vehicle may facilitate cooling of the charger. In some circumstances, however, the OSA vent system may inadvertently remain open. Therefore, it may be desirable to facilitates positive air pressure in the vehicle to prevent inflow of outside air in the event that the OSA vent system does not close.

Accordingly, a charger cooling air source selection method which facilitates positive air pressure in a vehicle to prevent inflow of outside air in the event that the OSA vent system does not close may be desirable for some applications.

SUMMARY

Illustrative embodiments of the disclosure are generally directed to a charger cooling air source selection method which facilitates positive air pressure in a vehicle to prevent inflow of outside air in the event that the OSA vent system does not close. An illustrative embodiment of the method includes cooling a vehicle battery charger by opening an outside air vent door in a vehicle and drawing outside air through the outside air vent door; determining whether the outside air vent door will close; and if the outside air vent door will not close, establishing and maintaining positive air pressure in a cabin of the vehicle by ensuring an open configuration of a recirculation door in the vehicle.

BRIEF DESCRIPTION OF THE DRAWINGS

Illustrative embodiments of the disclosure will now be described, by way of example, with reference to the accompanying drawings, in which:

FIG. 2 is a top view of a vehicle illustrating normal flow of outside air into the vehicle through the OSA vent system in implementation of an illustrative embodiment of the charger cooling air source selection method;

FIG. 3 is a side view of a vehicle illustrating normal flow of outside air into the vehicle through the OSA vent system in implementation of an illustrative embodiment of the charger cooling air source selection method;

FIG. 4 is a top view of a vehicle illustrating maintenance of positive air pressure in the vehicle under circumstances in which the OSA vent system inadvertently remains opened in implementation of an illustrative embodiment of the charger cooling air source selection method;

FIG. 5 is a side view of a vehicle illustrating maintenance of positive air pressure in the vehicle under circumstances in which the OSA vent system inadvertently remains opened in implementation of an illustrative embodiment of the charger cooling air source selection method;

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable users skilled in the art to practice the disclosure and are not intended to limit the scope of the claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Figure 1:
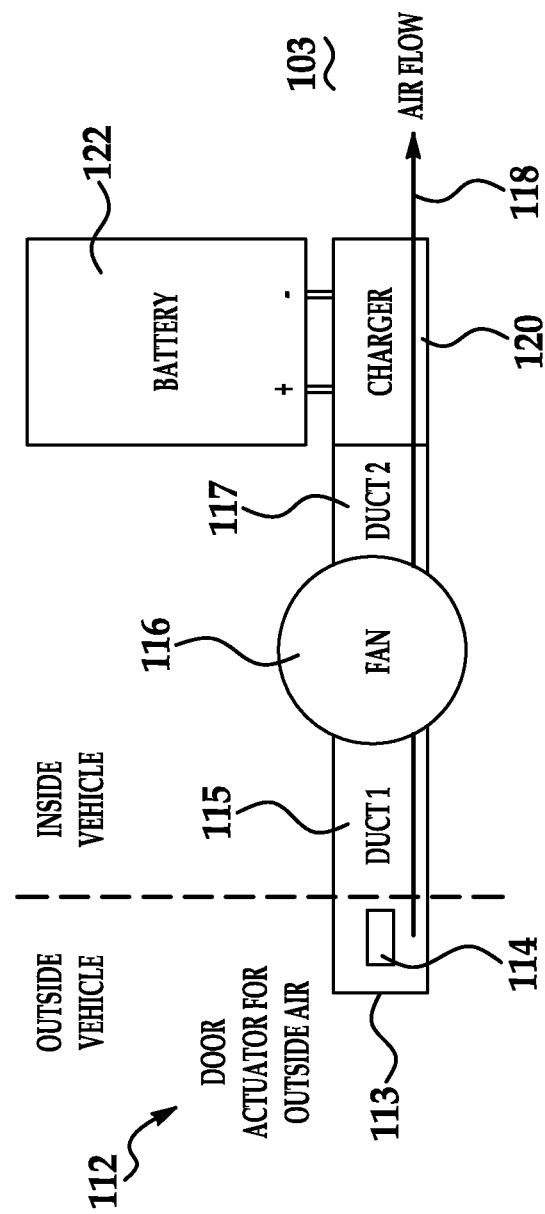
FIG. 1 is a block diagram of an exemplary outside air (OSA) vent system of a vehicle in implementation of an illustrative embodiment of the charger cooling air source selection method.

Referring initially to FIGS. 1-5, a vehicle 100 in implementation of an illustrative embodiment of the charger cooling air source selection method is shown. The vehicle 100 may have a vehicle front end 101, a vehicle rear end 102, a vehicle cabin 103 and a vehicle dashboard 104 in the vehicle cabin 103. A recirculation door 108 may be included in the vehicle dashboard 104. Responsive to operation of the vehicle climate control fan (not shown), the recirculation door 108 may facilitate selective introduction of outside air 109 (FIG. 4) into the vehicle cabin 103 or recirculation of inside air 134 in the vehicle cabin 103, such as in the conventional manner. In exemplary operation, the recirculation door 108 is closed during hot humid weather when the operator of the vehicle 100 selects the "Max A/C" setting on the vehicle climate control system, thereby recirculating cabin air to reduce the heat load on the evaporator and cool the vehicle cabin 103 more quickly. As shown in FIGS. 3 and 4, a battery cooling fan 130 may circulate battery cooling air 131 from inside the vehicle cabin 103 through a vehicle battery 122 (FIG. 1).

An outside air (OSA) vent system 112 may be provided at the vehicle rear end 102 of the vehicle 100. As shown in FIG. 1, the OSA vent system 112 may include an OSA vent door 113 which is selectively opened and closed by operation of a OSA vent door actuator 114. A fan inlet duct 115 may lead from the OSA vent door 113. An OSA fan 116 may be provided in the fan inlet duct 115. A fan outlet duct 117 may lead from the OSA fan 116. A battery charger 120 for a vehicle battery 122 is disposed in thermally conductive contact with the fan outlet duct 117. As shown in FIGS. 2-5, an air extractor 132 may be provided at the vehicle rear end 102 of the vehicle 100 to extract inside air 134 from the vehicle cabin 103.

The outside air vent system 112 may be configured to maintain the OSA vent door 113 in a closed configuration unless the battery charger 120 requires cooling and the temperature of the vehicle cabin 103 exceeds a predetermined set temperature. As shown in FIG. 1, upon opening of the OSA vent door 113 by the OSA vent door actuator 114, the OSA fan 116 draws outside air 118 through the fan inlet duct 115 and the fan outlet duct 117 and into the vehicle cabin 103. As shown in FIGS. 2 and 3, the inflowing outside air 118 cools the battery charger 120 to within a target temperature range which ensures optimal operation of the battery charger 120. Upon cooling of the battery charger 120 to within the target temperature range, the OSA vent door actuator 114 may close the OSA vent door 113 and further operation of the OSA fan 116 may be terminated. Throughout operation of the outside air vent system 112, the recirculation door 108 may remain closed to facilitate recirculation of air in the vehicle cabin 103. The air extractor 132 may remove inside air 134 from the vehicle cabin 103.

According to the charger cooling air source selection method, the vehicle controller may be configured to operate the recirculation door 108, the vehicle climate control fan (not shown) and the outside air vent system 112 in an error mitigation strategy in the event that the OSA vent door 113 inadvertently does not close after cooling of the battery charger 120. The error mitigation strategy maintains positive air pressure 126 in the vehicle cabin 103 and causes the recirculation door 108 to open if it is closed and prevents the recirculation door 108 from closing if it is open, and operates the vehicle climate control fan (not shown). Accordingly, as shown in FIGS. 4 and 5, outside air 109 flows into the vehicle 100 through the open recirculation door 108. The inflowing outside air 109 maintains positive air pressure 126 in the vehicle cabin 103, facilitating flow of inside air 134 from the vehicle cabin 103 through the OSA vent door 113. The positive air pressure 126 in the vehicle cabin 103 prevents exhaust as well as hot and humid air from entering the vehicle cabin 103 from the rear area of the vehicle 100 through the OSA vent door 113. Since the need to cool the battery charger 120 and operate the vehicle climate control in the "Max A/C" setting on the vehicle climate control system may be likely to occur under the same hot environmental conditions, the probability of the OSA vent door 113 being opened and the recirculation door 108 being closed may be high.

Figure 6:
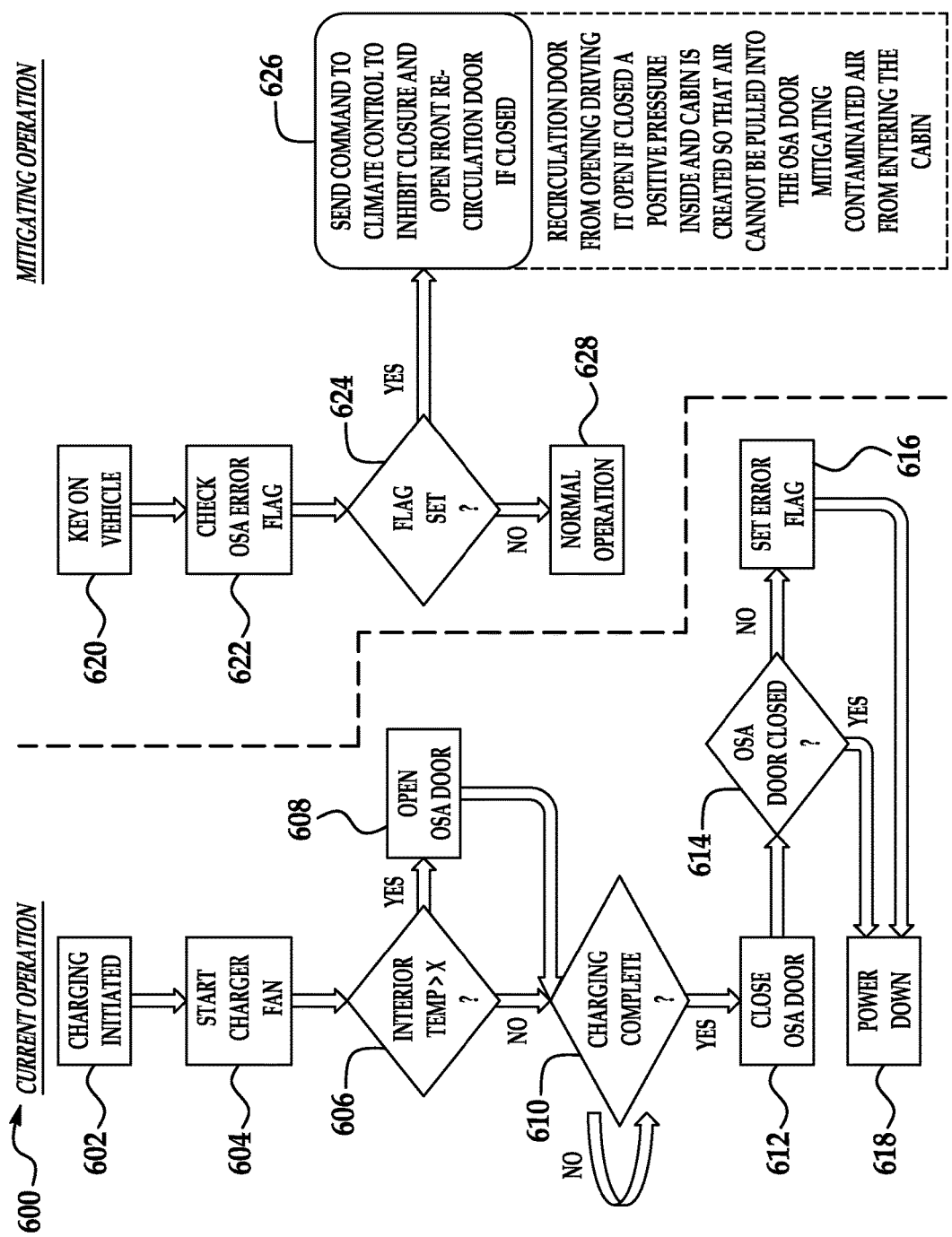
FIG. 6 is a flow diagram which illustrates an illustrative embodiment of the charger cooling air source selection method.

Referring next to FIG. 6, a flow diagram 600 which illustrates an illustrative embodiment of the charger cooling air source selection method is shown. Normal operation of a recirculation door and outside air vent system is shown in blocks 602-618. Mitigating operation of the recirculation door and outside air vent system is shown in blocks 620-628. In block 602, charging of the vehicle battery by operation of the battery charger may be initiated. In block 604, a charger fan which cools the charger may be started. In block 606, a determination may be made as to whether the temperature of the vehicle cabin exceeds a predetermined set temperature. If yes, then the OSA vent door of the outside air vent system may be opened to cool the vehicle cabin interior. If no, then a determination may be made as to whether charging of the vehicle battery is complete.

Upon charging of the vehicle battery in block 610, the OSA vent door may be closed in block 612. In block 614, verification may be made as to whether the OSA vent door is closed. If the OSA vent door is closed in block 614, then the OSA vent door is powered down in block 618. If the OSA vent door is not closed in block 614, then an error flag is set in block 616 and the OSA vent door is powered down in block 618.

In the event that the OSA vent door is not closed in block 614 and the error flag is set in block 616, mitigating operation of the recirculation door and outside air vent system is carried out in blocks 620-628. In block 620, the vehicle is keyed on. In block 622, the OSA error flag which was set in block 616 is checked. In block 624, verification may be made as to whether the OSA error flag was set. If yes, then in block 626, a command may be transmitted to the vehicle climate control system to inhibit closure and open the front recirculation door if closed. Accordingly, positive air pressure develops in the vehicle cabin such that air is not able to enter the cabin interior through the open OSA vent door. If the OSA error flag was not set in block 624, then normal operation of the recirculation door may be carried out in block 628.

Figure 7:
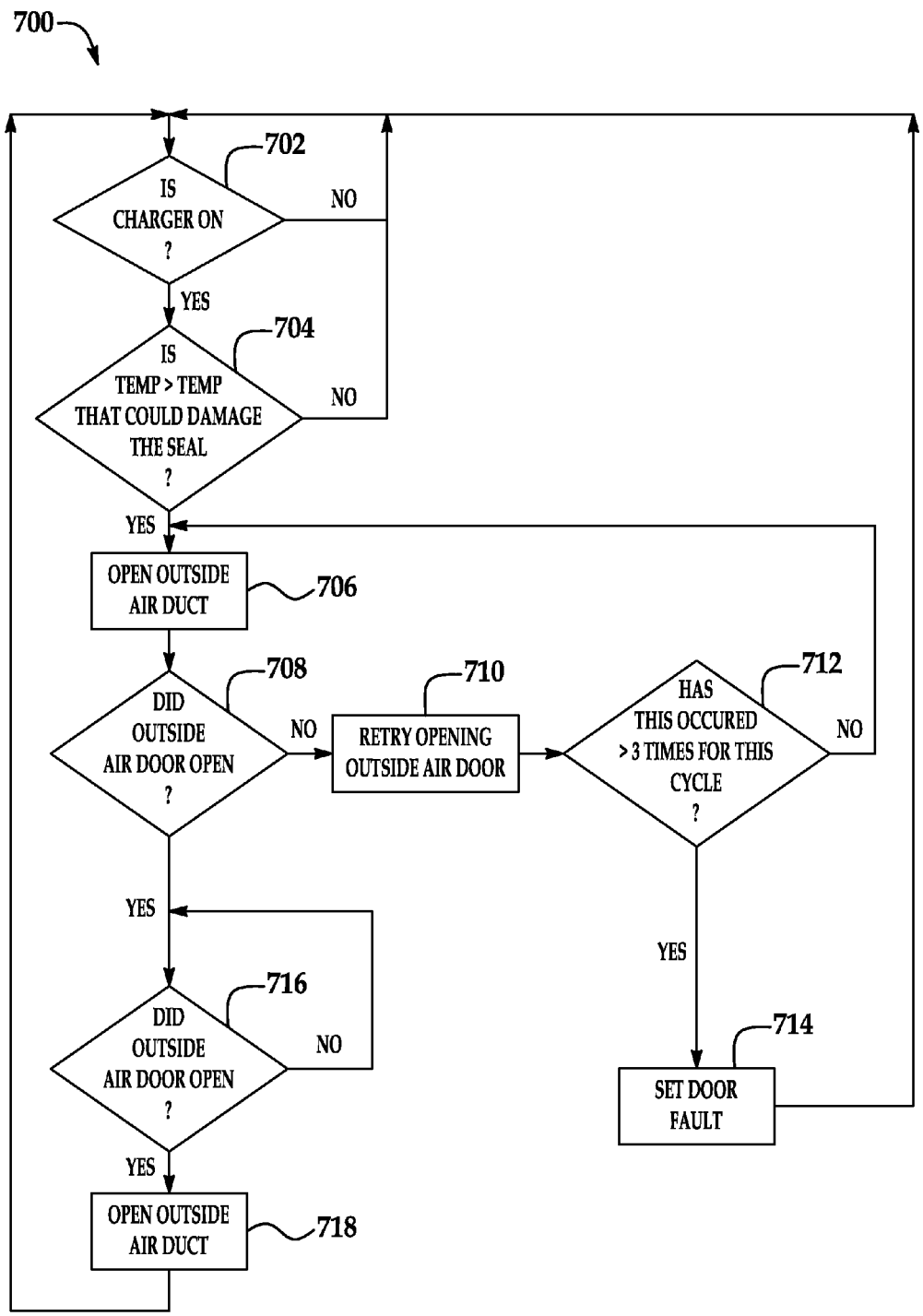
FIG. 7 is a flow diagram which illustrates an exemplary method of opening an OSA vent system according to an illustrative embodiment of the charger cooling air source selection method.

Referring next to FIG. 7, a flow diagram 700 which illustrates an exemplary method of opening an OSA vent system according to an illustrative embodiment of the charger cooling air source selection method is shown. In block 702, a determination may be made as to whether the battery charger is on. If the answer to the query is yes, a determination may be made as to whether the temperature of the battery charger exceeds a temperature in which the battery charger could be damaged. If no, the method may return to block 702. If the answer to the query in block 702 is yes, the OSA vent door of the outside air vent system is opened in block 706. In block 708, verification may be made as to whether the OSA vent door has opened. If the OSA vent door has not opened, then in block 710, opening of the OSA vent door may be retried. In block 712, a determination may be made as to whether failure of the OSA vent door to open has occurred more than 3 times for the cycle. If not, then the method may return to block 706. If so, then a door fault may be set in block 714 and the method may return to block 702.

If the OSA vent door has been opened in answer to the query in block 708, then a determination may be made as to whether charging has been completed in block 716. If not, the query may be continued in block 716. If yes, then the OSA vent door may be closed in block 718 and the method may return to block 702.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A controller-implemented charger cooling air source selection method, a controller causing steps comprising:
cooling a vehicle battery charger by opening an outside air vent door of the vehicle and drawing outside air through the outside air vent door while maintaining a recirculation door in a closed configuration, the outside air vent door in a rear portion of the vehicle, the recirculation door in a front portion of the vehicle;
determining whether the outside air vent door will close in response to an attempt to close the outside air vent door caused by the controller; and
if the outside air vent door will not close, establishing and maintaining positive air pressure in a cabin of the vehicle by ensuring an open configuration of the recirculation door in the vehicle, the recirculation door configured to close the cabin to outside air through the recirculation door in the closed configuration and open the cabin to outside air through the recirculation door in the open configuration.

2. The method of claim 1 further comprising drawing outside air through the outside air vent door by operating an outside air fan.

3. The method of claim 1 wherein establishing positive air pressure in a cabin of the vehicle by ensuring an open configuration of the recirculation door in the vehicle further comprises operating a vehicle climate control fan.

4. The method of claim 1 wherein cooling a vehicle battery charger comprises opening the outside air vent door in the vehicle if a temperature of the cabin of the vehicle exceeds a predetermined set temperature.

5. The method of claim 1 wherein drawing outside air through the outside air vent door comprises drawing outside air through the outside vent door through a fan outlet duct disposed in thermally conductive contact with the vehicle battery charger.

6. The method of claim 1 wherein ensuring an open configuration of the recirculation door in the vehicle comprises opening the recirculation door from the closed configuration.

7. The method of claim 1 wherein ensuring an open configuration of the recirculation door in the vehicle comprises maintaining the recirculation door in the open configuration.

8. The method of claim 1 further comprising removing inside air from the cabin of the vehicle by operating an air extractor.

9. A controller-implemented charger cooling air source selection method, a controller causing steps comprising:
   charging a vehicle battery of a vehicle by operation of a vehicle battery charger;
   cooling the vehicle battery charger by opening an outside air vent door in a vehicle and drawing outside air from outside the vehicle through the outside air vent door into a cabin of the vehicle while maintaining a recirculation door in a closed configuration, the outside air vent door in a rear portion of the vehicle, the recirculation door in a front portion of the vehicle;
   determining whether the outside air vent door will close in response to an attempt to close the outside air vent door caused by the controller; and
   if the outside air vent door will not close, establishing and maintaining positive air pressure in the cabin of the vehicle by ensuring an open configuration of the recirculation door in the vehicle, the recirculation door configured to close the cabin to outside air through the recirculation door in the closed configuration and open the cabin to outside air through the recirculation door in the open configuration.

10. The method of claim 9 further comprising drawing outside air through the outside air vent door by operating an outside air fan.

11. The method of claim 9 wherein establishing positive air pressure in a cabin of the vehicle by ensuring an open configuration of the recirculation door in the vehicle further comprises operating a vehicle climate control fan.

12. The method of claim 9 wherein cooling a vehicle battery charger comprises opening the outside air vent door in the vehicle if a temperature of the cabin of the vehicle exceeds a predetermined set temperature.

13. The method of claim 9 wherein drawing outside air through the outside air vent door comprises drawing outside air through the outside vent door through a fan outlet duct disposed in thermally conductive contact with the vehicle battery charger.

14. The method of claim 9 wherein ensuring an open configuration of the recirculation door in the vehicle comprises opening the recirculation door from the closed configuration.

15. The method of claim 9 wherein ensuring an open configuration of the recirculation door in the vehicle comprises maintaining the recirculation door in the open configuration.

16. The method of claim 9 further comprising removing inside air from the cabin of the vehicle by operating an air extractor.

17. A controller-implemented charger cooling air source selection method, a controller causing steps comprising:
   charging a vehicle battery of a vehicle by operation of a vehicle battery charger;
   determining whether the vehicle battery charger requires cooling and a temperature of a cabin of the vehicle exceeds a predetermined set temperature;
   determining if the vehicle battery charger requires cooling and the temperature of the cabin of the vehicle exceeds the predetermined set temperature;
   if the vehicle battery charger requires cooling, cooling the vehicle battery charger by opening an outside air vent door and operating a vehicle climate control fan in a vehicle to draw outside air from outside the vehicle through the outside air vent door into a cabin of the vehicle by operating an outside air fan, the outside air vent door being opened while maintaining a recirculation door in a closed configuration, the outside air vent door in a rear portion of the vehicle, the recirculation door in a front portion of the vehicle;
   determining whether the outside air vent door will close in response to an attempt to close the outside air vent door caused by the controller; and
   if the outside air vent door will not close, establishing and maintaining positive air pressure in the cabin of the vehicle by ensuring an open configuration of the recirculation door in the vehicle, the recirculation door configured to close the cabin to outside air through the recirculation door in the closed configuration and open the cabin to outside air through the recirculation door in the open configuration.

18. The method of claim 17 wherein ensuring an open configuration of the recirculation door in the vehicle comprises opening the recirculation door from the closed configuration.

19. The method of claim 17 wherein ensuring an open configuration of the recirculation door in the vehicle comprises maintaining the recirculation door in the open configuration.

20. The method of claim 17 further comprising removing inside air from the cabin of the vehicle by operating an air extractor.

* * * * *